US009696435B2

(12) United States Patent
Gubbens et al.

(10) Patent No.: US 9,696,435 B2
(45) Date of Patent: Jul. 4, 2017

(54) HYBRID ENERGY CONVERSION AND PROCESSING DETECTOR

(71) Applicant: Gatan, Inc., Warrendale, PA (US)

(72) Inventors: Alexander Jozef Gubbens, Palo Alto, CA (US); Paul Mooney, Pleasanton, CA (US); Matthew Lent, Livermore, CA (US)

(73) Assignee: GATAN, INC., Warrendale, PA (US)

( * ) Notice: Subject to any disclaimer, the term of this patent is extended or adjusted under 35 U.S.C. 154(b) by 0 days.

(21) Appl. No.: 14/688,081

(22) Filed: Apr. 16, 2015

(65) Prior Publication Data

US 2015/0301196 A1   Oct. 22, 2015

Related U.S. Application Data

(60) Provisional application No. 61/981,138, filed on Apr. 17, 2014.

(51) Int. Cl.
*G01T 1/20* (2006.01)
*H01J 37/244* (2006.01)

(52) U.S. Cl.
CPC .......... *G01T 1/2018* (2013.01); *H01J 37/244* (2013.01); *H01J 2237/2441* (2013.01); *H01J 2237/2443* (2013.01); *H01J 2237/2446* (2013.01); *H01J 2237/24485* (2013.01)

(58) Field of Classification Search
USPC ..................................... 250/311, 362, 370.11
See application file for complete search history.

(56) References Cited

U.S. PATENT DOCUMENTS

| 4,831,255 | A  | * | 5/1989  | Krivanek ................... G01T 1/16 250/305 |
| 5,517,033 | A  |   | 5/1996  | Krivanek et al. |
| 7,952,073 | B2 | * | 5/2011  | Bilhorn ................. H01J 37/244 250/310 |
| 8,309,924 | B2 | * | 11/2012 | Burghartz ................. G01J 5/60 250/332 |
| 8,334,512 | B2 |   | 12/2012 | Luecken et al. |
| 2010/0025579 | A1 |   | 2/2010 | Bilhorn |

(Continued)

FOREIGN PATENT DOCUMENTS

WO       2013118111 A1   8/2013

*Primary Examiner* — Phillip A Johnston
(74) *Attorney, Agent, or Firm* — Snyder, Clark, Lesch & Chung, LLP

(57) ABSTRACT

There is disclosed a hybrid arrangement of more than one electron energy conversion mechanism in a detector arranged physically such that the electron image can be acquired from both energy converters in such a manner that selected high-illumination parts of the image can be imaged with an indirectly coupled scintillator detector and the remainder of the image acquired with the high-sensitivity/ direct electron portion of the detector without readjustments in the beam position or mechanical positioning of the detector parts.

Further, a mechanism to allow dynamically switchable or simultaneous linear and counted signal processing from each pixel of the image so that high-illumination areas can be acquired linearly without the severe dose rate limitation of counting and low-illumination regions can be acquired with counting, the switchover point determined by the dose rate at which signal quality breaks even between linear and counting modes.

15 Claims, 24 Drawing Sheets

(56) References Cited

U.S. PATENT DOCUMENTS

2010/0074396 A1\* 3/2010 Schmand ............... A61B 6/032
                                                    378/19
2012/0025074 A1    2/2012 Barbi et al.

\* cited by examiner

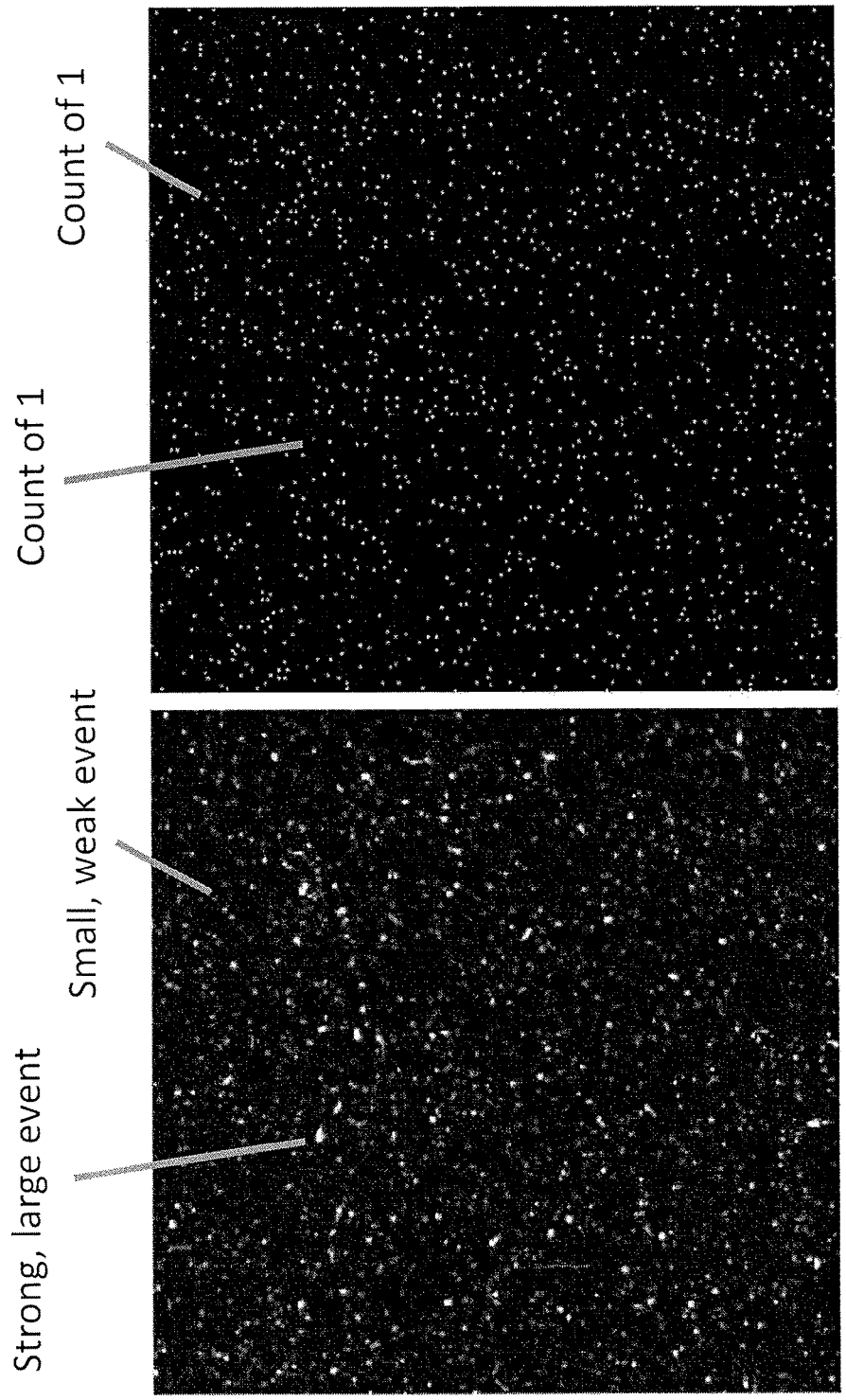

HYBRID ENERGY CONVERSION AND PROCESSING DETECTOR

CROSS REFERENCE TO RELATED APPLICATIONS

This non-provisional utility application claims priority to provisional application Ser. 61/981,138, filed Apr. 17, 2014 and entitled "High Energy Conversion and Processing Detector." The entire disclosure of the provisional application is incorporated herein by reference.

FIELD OF THE INVENTION

The invention relates generally to the field of electron microscopy image detection.

BACKGROUND OF THE INVENTION

For much of the history of electron microscopy up until the 1990s, sheet film was the main image recording medium. In 1990, electronic detectors based on scintillators coupled to scientific semiconductor image sensors with either fused fiber or lens optics were introduced and began to replace film for most image recording applications. One of the main advantages of these sensors was for the applications of electron energy loss spectroscopy (EELS) and electron diffraction (ED) due the dramatically increased dynamic range of these scintillator-optics-semiconductor sensor. Both of these applications involve the use of a focused beam, with specimen information derived from electrons which are diverted from the main path either due to energy loss (subsequently made manifest with a bending magnet) or due to electron diffraction. The deflected beams can be several to many orders of magnitude weaker than the un-deflected beam as shown in FIGS. 1A, 1B, 2A and 2B. The graph in FIG. 1B shows that the diffraction spots in FIG. 1A have dynamic range of several orders of magnitude. FIGS. 2A and 2B show the dynamic range needed in EELS. Semiconductor sensors, typically CCDs for imaging and photodiode arrays and CCDs for spectroscopy, have significantly higher dynamic range than film, especially scientific sensors which were made with larger pixels. Dynamic ranges of up to 20,000 have been shown possible in single exposures with merged multiple exposures extending that limit even further. In addition, scintillators coupled optically to the sensor protect the sensor from the radiation damage effects that can results from either direct exposure of the sensor to the beam or from exposure to x-rays generated at the scintillator which can then travel to the sensor. In the case of lens coupling, the glass of the lens and the distance the lens allows to be created between scintillator and sensor confer the protective effect. In the case of fused fiber optic plates, the high density glass provides the x-ray protection. In both cases, the beam is stopped long before it can hit the sensor and cause damage directly. For both these reasons, the scintillator/optic/semiconductor sensor has replaced film in 100% of diffraction applications and made possible the parallel acquisition of spectra which wasn't an option at all before these sensors made it possible.

FIG. 3A shows a prior art lens-coupled scintillator indirect detector having a scintillator 301, a glass prism 302, optical lenses 303, 304 and a CCD detector 305. FIG. 3B shows a prior art fused fiber-optic plate coupled indirect detector having a scintillator 311, an optical fiber bundle, 312 and a CCD detector 313.

Certain imaging applications, most notably cryo-electron microscopy of proteins and cellular cryo-tomography drove a need for a replacement of film which did not have a dynamic range requirement but rather a sensitivity and resolution requirement. In the last few years, a class of detectors has been developed using radiation hardened silicon active pixel detectors which is now successfully replacing film and extending the resolution limits attainable in structural biology. This technology is usually referred to as direct detection technology and cameras using this technology as direct detectors. In contradistinction to these detectors, the scintillator/optic/sensor detectors described above are now commonly referred to as indirect detectors.

Direct detectors make these improvements in structural biology resolution in a number of ways. First, silicon, being lighter than typical scintillator and optical materials, scatters the electron beam less giving a finer point spread function. Second, the directly detected incoming electron makes a much stronger signal. Third, it is possible to thin the device to allow the beam to pass through without additional noisy backscatter. While thinning is possible with lens coupled scintillators (see, for example, U.S. Pat. No. 5,517,033 all references cited herein are incorporated by reference), thinning comes with a severe loss of signal strength. FIG. 3C shows a prior art non-thinned ("bulk") direct detector 320 and FIG. 3D shows a prior art back-thinned direct detector 330. In a direct detector there is no sensitivity penalty for thinning.

Finally, as a result of the first three benefits described above, (improved point spread function, higher signal strength and reduced backscatter from thinning), the signal from a direct detector can be processed to result in a counting mode analogous to that often used with a photomultiplier tube and with the same benefit. When an incoming electron is counted as a 1 and added into a frame buffer, the variations in energy deposited by the incoming electron are stripped off and not summed as they would be in the case for a linear, integrating detector, whether direct or indirect. Because the acquired image no longer contains that variation in energy, a nearly noise-free acquisition is possible.

A second variant of counting is possible in which the position of entry of the electron is estimated to sub-pixel accuracy by centroiding the deposited energy. This method is commonly referred to a super-resolution. FIG. 4 shows the detection of a single incident electron with a super-resolution detector. FIG. 4A shows an electron landing on an arbitrary location within a pixel on a multipixel detection device. FIG. 4B shows scatter from incoming electrons in a localized region near the point of entry to the electron. FIG. 4c shows how the amount of scattered detected signal in nearby pixels is related to the location of the electron's entry point. FIG. 4d shows that selection of the pixel with the highest scattered signal locates the point of 5 entry to the nearest pixel. FIG. 4e shows that finding the center of mass of the distribution of scattered charge allows location of the entry point to sub-pixel accuracy.

Counting and super-resolution dramatically improve the sensitivity performance as measured by detective quantum efficiency (DQE), the ratio of detected signal to noise ratio to incoming signal to noise ratio over the performance of a silicon direct detection imager.

FIG. 5 shows the sensitivity improvement summarized: of direct detection over indirect detection (A), of counting direct detection over just direct detection (B) and of the effect that super-resolution adds signal over the Nyquist frequency (C) of the physical pixel. Part of the DQE benefit comes from the additional benefit of counting of dramatically reducing detection of background noise. It is clear that indirect detectors have a serious disadvantage in terms of sensitivity. This is both in terms of DQE as shown in the graph in FIG. 5, but also in terms of the background noise. Both Electron energy loss spectroscopy (EELS) and electron diffraction (ED) have a strong need for high sensitivity and good background rejection for the weak parts of the signal.

Direct detectors (DD) have the drawback that the electron, while depositing signal energy in the pixel, will also damage it due to charge injected into insulators, as well as knock-on damage to the silicon crystal structure. This gives direct detectors a lifetime dose limit. While this dose limit has been dramatically increased by improvements to pixel design layout, reductions in feature sizes which reduce oxide thickness and thereby allow trapped electrons to diffuse out more readily, and thinning, which eliminates the energy deposited by backscatter, total lifetime dose is still limited to significantly lower levels than that of fiber-optically or lens-optically coupled scintillators. This fact would be severely limiting in applications like EELS and ED for which the undeflected beam is often many orders of magnitude higher than the low intensity part of the 5 signal and would reduce the sensor lifetime, which is measured in years for cyro-electron microscopy, to hours.

For a DD detector to count electron arrival events they must be spatially and temporally separated on the detector. DQE is only modestly affected for 300 kV electrons at event densities up to about 0.025 per pixel (~40 pixels per electron event). This is accomplished by an extreme speedup in frame-rate. A framerate of 400 fps as used on the Gatan K2 Counting direct detection camera allows a dose rate of 10 electrons per pixel per second at that event density. While that dose rate is adequate for low-dose imaging in cryo-microscopy for which it was developed, it is too low for use in higher-dose and in high-dynamic range applications such as EELS and ED as described in FIGS. 1 and 2. While it is conceivable that frame rates could be increased enough to handle medium dose ranges as shown in FIG. 2B, it is unrealistic to think that counting could be used for the high intensity parts of either the EELS or the ED signals. For the current generation of K2 counting direct detector, a commercial camera developed by Gatan, Inc. which uses the prior art detector arrangement of FIG. 3D in conjunction with extremely fast readout to separate the incoming electron events into different frames and a fast processor to count or centroid the electron events and sum them, the useable dose rate is 400 times lower in counting mode than in linear mode. FIG. 6 shows the sparsification by speed needed to allow counting. On the left, the actual signal generated by a sparse beam is shown, illustrating that each event covers multiple pixels, with varying size. Sparsification needs to be sufficient to prevent miscounting or poor centroiding due to overlap of scatter from one event onto another. The image on the right of FIG. 6 shows the results of counting the frame on the left. It also illustrates the extent to which the variability both in event intensity and in event size is reduced through the counting process.

Relevant patents in the field include U.S. Pat. No. 7,952,073 ("Bilhorn") and U.S. Pat. No. 8,334,512 ("Luecken"). All references cited herein are incorporated by reference in their entirety.

The inadequacy of indirect detectors in resolution and sensitivity for dealing with the weak parts of EELS and ED signals and the inadequacy of direct detection to deal with the strong parts of EELS and ED signals coupled with the lack of any workaround in the prior art for acquiring both strong and weak signals simultaneous with high quality creates a need for a new solution.

Electron energy loss spectroscopy (EELS) and electron diffraction (ED) would stand to benefit significantly if the capability to read the weakest signals were added to existing capability. This is especially true for scanning transmission electron microscope spectrum imaging (STEM SI), for which a spectrum is taken at each of a N×M raster of scanned specimen pixels and used to derive elemental and electronic contrast images. See Gatan datasheet, "GIF Quantum", published March 2014. This technique, which requires high speed to cover a reasonable number of pixels over a reasonable area of a specimen requires high sensitivity to very weak signals in the regions used for elemental contrast and yet still needs to be able to acquire and digitize the un-deflected beam for normalization. Similar applications are being developed for electron diffraction with STEM with similar requirements.

U.S. Pat. No. 8,334,512 is a patent in the field and discusses use of a fast detector positioned below the thinned imaging detector at some distance as a zero-loss beam position detector but due to the poor resolution associated with its position, cannot be used as a detector for low-loss spectroscopic information.

In addition, EELS and ED signals in their most general application can, and especially in these STEM applications, do vary rapidly in time, making serial illumination first of a low-sensitivity, high-robustness detector and second of a high-sensitivity low-robustness detector an impractical solution for the high dynamic range application.

Therefore there exists a need in the prior art for a technology which would allow simultaneous robust and high-quality imaging of high-intensity and weak signals in the same field of view.

DESCRIPTION OF THE DRAWINGS

FIG. 6 are two images showing the effect of high speed readout to separate events into different frames (left) and the effect of counting those events (right)

DETAILED DESCRIPTION OF THE INVENTION

In an embodiment of the invention, there is disclosed a hybrid arrangement of more than one electron energy conversion mechanism in a detector arranged physically such that the electron image can be acquired from both energy converters in such a manner that selected high-illumination parts of the image can be imaged with an indirectly coupled scintillator detector and the remainder of the image acquired with the high-sensitivity/direct electron portion of the detector without readjustments in the beam position or mechanical positioning of the detector parts.

Figure 5:
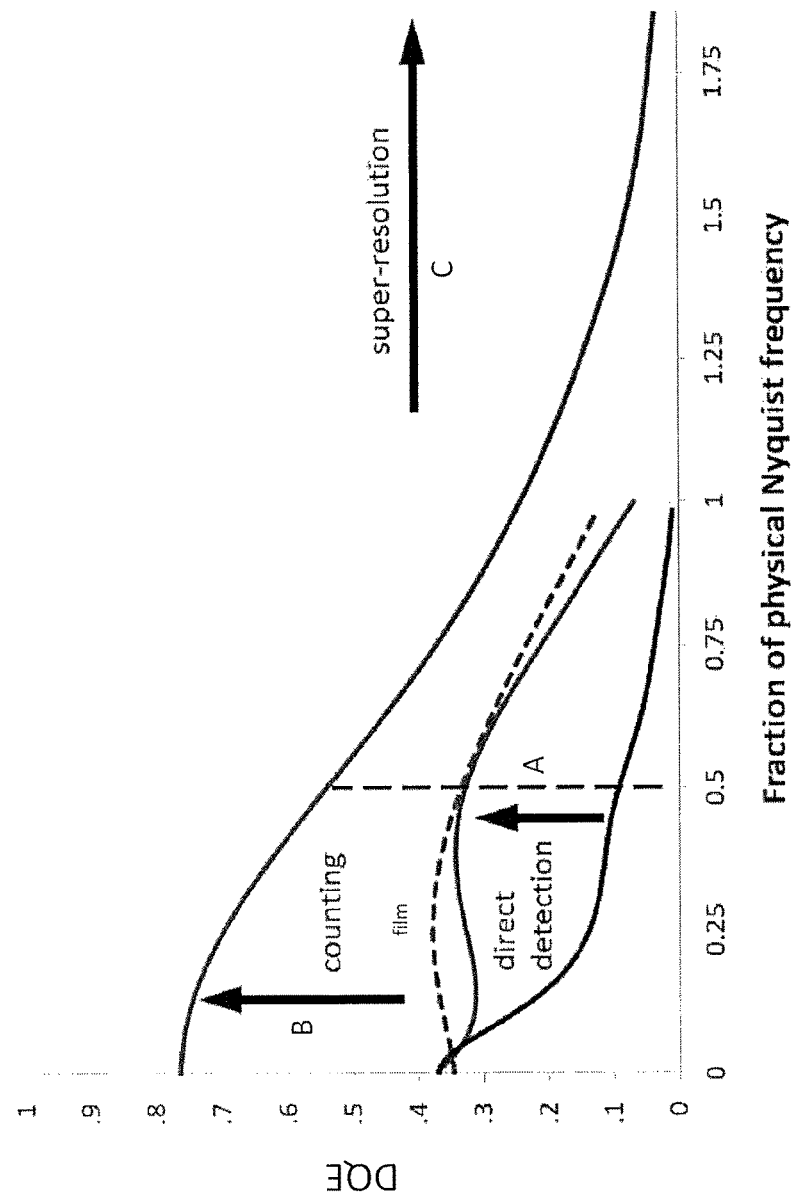
FIG. 5 is a graph describing the prior art direct detector, prior art electron counting and of prior art electron centroiding using detective quantum efficiency (DQU) as a measure of sensitivity.

Further, a mechanism is included in the signal processor to allow dynamic switching between counted and linear readout modes so that high-illumination areas can be acquired linearly without the severe dose rate limitation of counting and low-illumination regions can be acquired with counting to provide the very high signal quality needed for low dose and long exposures. Alternatively or in addition, the ability to perform simultaneous linear and counted signal processing from each pixel of the image is provided to allow subsequent selection or combination of linear and counted signals offline after acquisition. Both methods would make use of a switchover illumination intensity above which the transition from counted to linear would be made. The switchover would be the illumination intensity at which the signal quality was the same for counted and linear modes. Signal quality would typically be measured using detective quantum efficiency (DQE), as used in FIG. 5 to compare different detectors. DQE of a counting detector begins to degrade as illumination rate grows above the level of 1 electron per 40 pixels and reaches the level of a linear detector at a dose rate between 1 electron per 20 pixels and 1 electron per 10 pixels. In this manner, each pixel in the image can be read out and processed in the most optimal fashion.

Figure 7A:
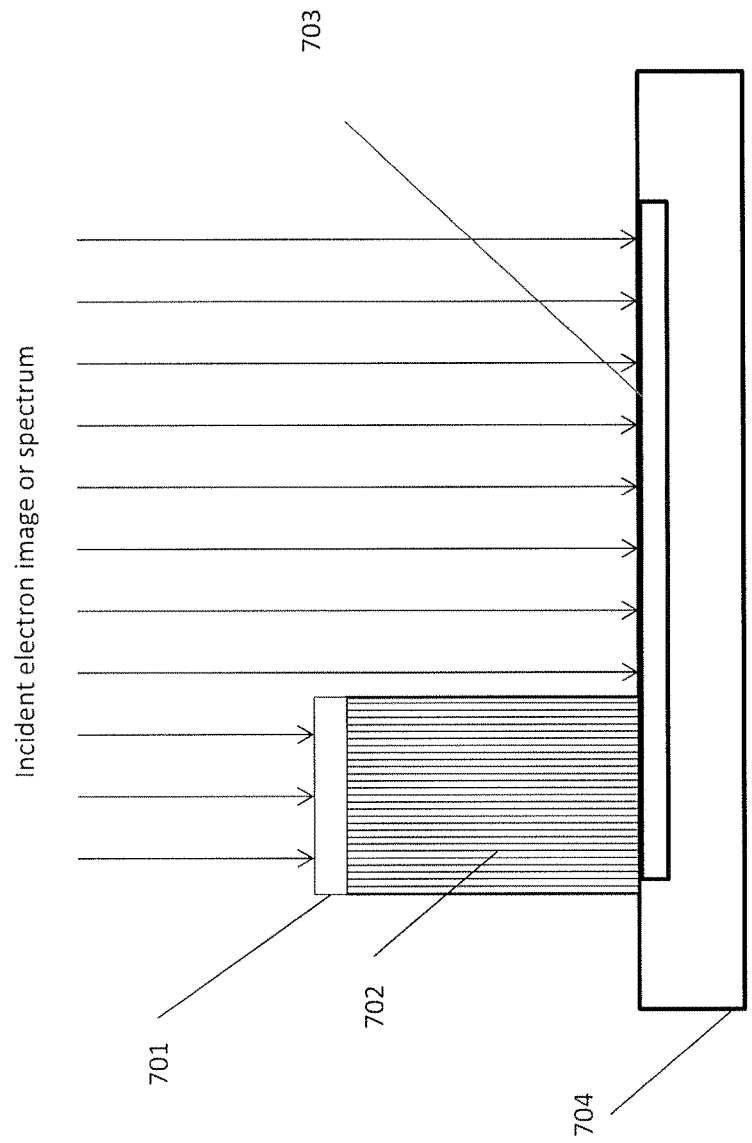
FIG. 7A shows a hybrid detector design using a fiber-optically coupled scintillator on part of the monolithic detector array.
Figure 7B:
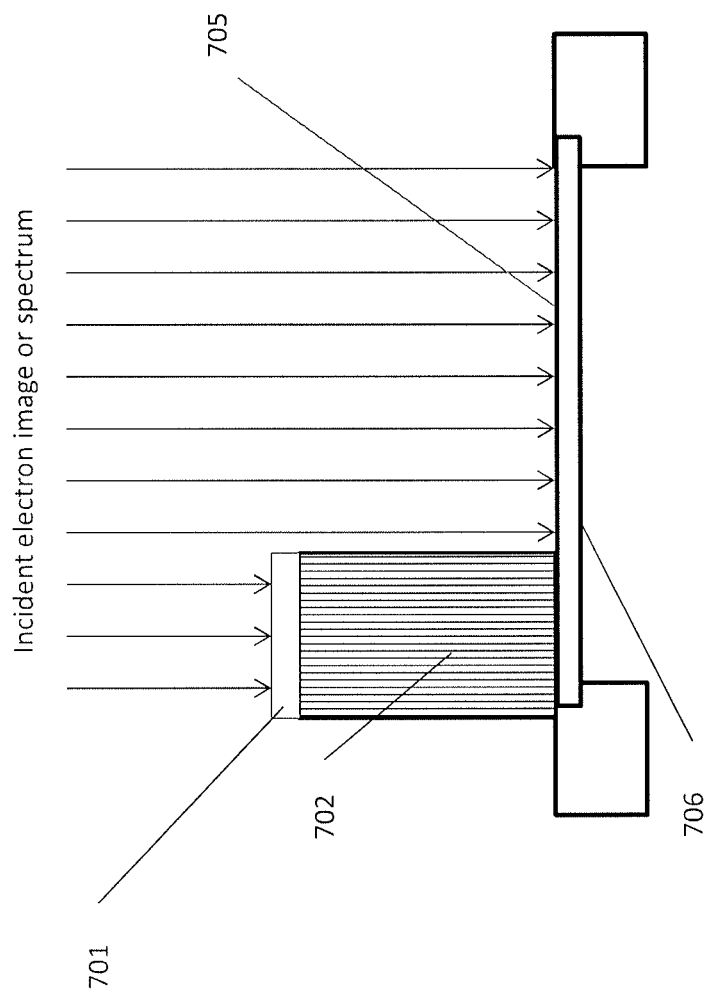
FIG. 7B shows a hybrid detector design using a fiber-optically coupled scintillator on part of the monolithic thinned detector array.
Figure 7C:
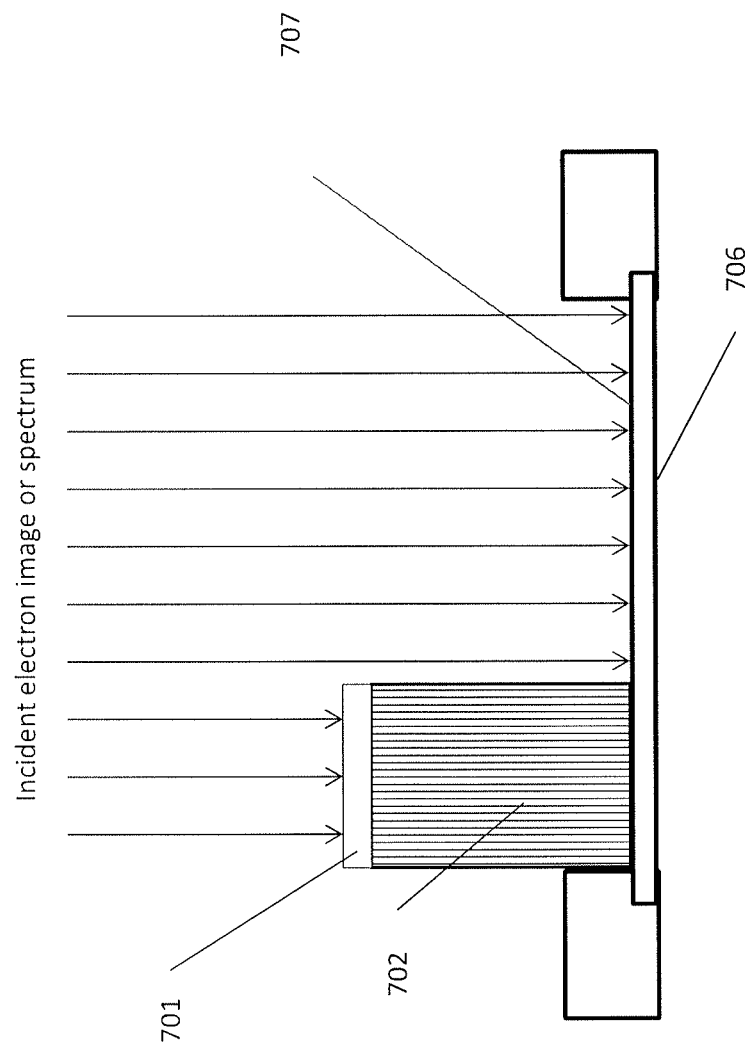
FIG. 7C shows a hybrid detector design using a fiber-optically coupled scintillator on part of the monolithic back-illuminated thinned detector array.
Figure 7D:
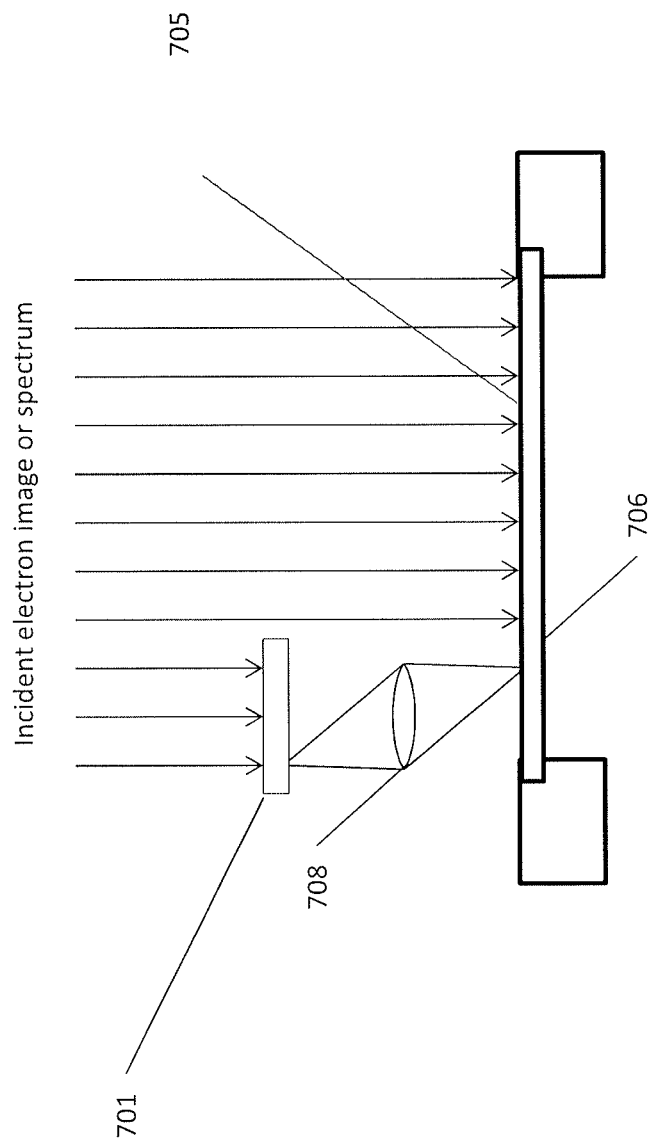
FIG. 7D shows a hybrid detector design using a lens-coupled scintillator on part of the monolithic front- (or back-) illuminated thinned detector array.
Figure 7E:
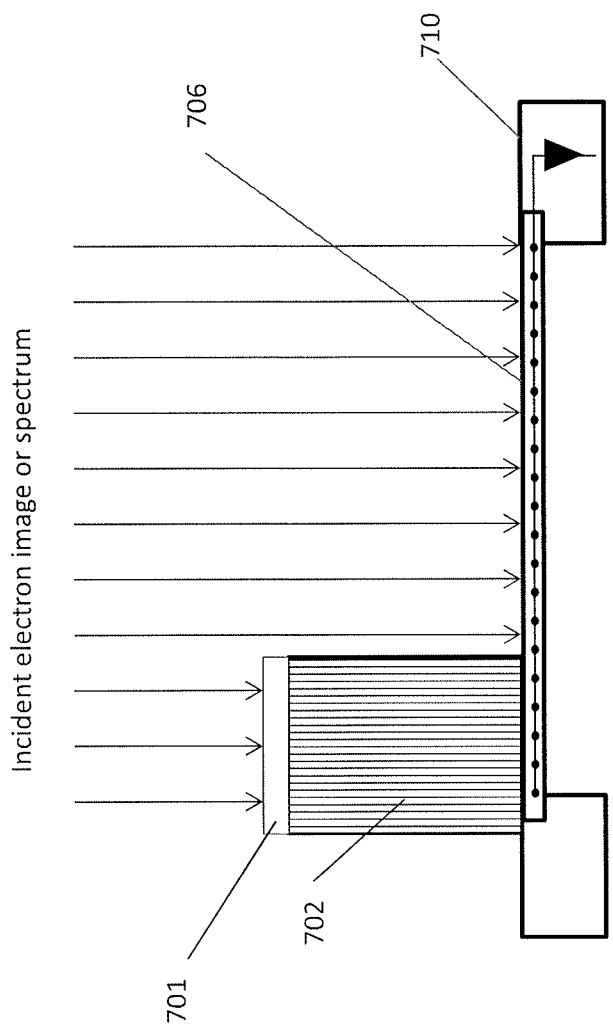
FIG. 7E shows a hybrid detector design using a fiber-optically coupled scintillator on part of the monolithic thinned detector array with coordinated simultaneous read-out of both optically-coupled and direct detection portions of the detector.
Figure 7F:
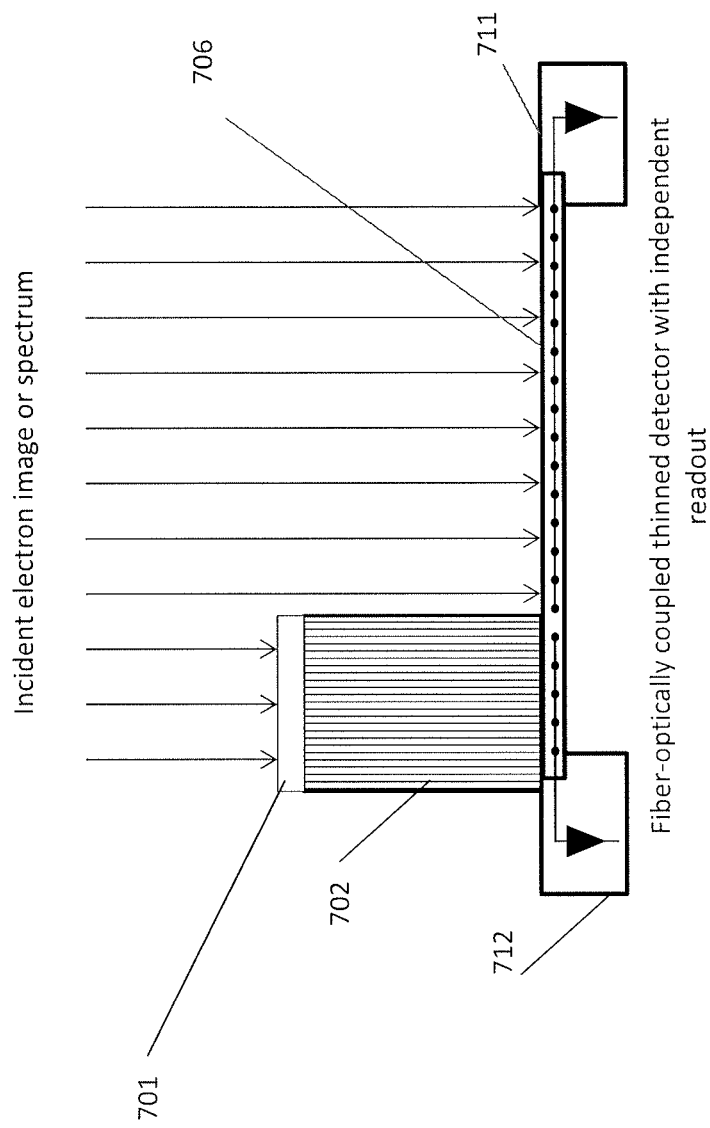
FIG. 7F shows a hybrid detector design using a fiber-optically coupled scintillator on part of the monolithic thinned detector array with independent simultaneous read-out of both optically-coupled and direct detection portions of the detector.

Further, because counted and linear modes have different transfer curves (the functional relationship of illumination to counts) and frequency response or modulation transfer function (MTF), signal processing will be provided to remove the intensity and resolution differences between the linear and counted signals. Hybrid detector realizations can be categorized by location of scintillator (in contact with the detector or not, above direct detector or below) by coupling means (fused fiber optic plate or lens-coupling), by which side of the direct detection device is coupled to (front side or back side), by whether the direct detection device is thinned or not, by readout means (single-sensor, all read out together, single sensor with integrated split 5 readout, and dual sensor configurations), by processing means (linear, counted or both). Many combinations of these factors can be envisioned. A number of representative combinations are shown in FIGS. 7-10. FIG. 7A-7D show various options for coupling a scintillator to the direct detection device with the scintillator not in contact with the direct detection device. FIG. 7A shows a scintillator 701 above the device coupled by a fiber optic plate 702 to the frontside 703 of 10 a non-thinned bulk silicon direct detection device 704. FIG. 7B shows the same arrangement as FIG. 7A but coupled to the front-side 705 of a thinned direct detection device 706. FIG. 7C shows a scintillator 701 fiber-optically coupled 702 to the backside 707 of a back-thinned direct detection device 706. And FIG. 7D shows a scintillator 702 lens-optically coupled 708 to a frontside thinned direct detection device. FIGS. 7E and 7F illustrate two possibilities for readout 15 of the direct detection device 706 which could apply to any coupling type or position but are here shown in conjunction with the same fiber-optically coupled scintillator arrangement of FIG. 7B. FIG. 7E shows the detector 706 being read out via a unified and coordinated mechanism 710 that reads out the whole of the device, optically coupled and direct-detection in the same way. FIG. 7F shows a device with the readout split in to two sections 711, 712 at the location of the 20 transition from optical coupling to direct detection. This arrangement would allow for the high-intensity low-loss and zero loss beams to be read out independently and potentially faster than the direct detection portion of the detector. Faster readout would then attenuate the signal strength in each readout of the high-intensity signal and allow a greater dynamic range as a result.

Figure 1A:
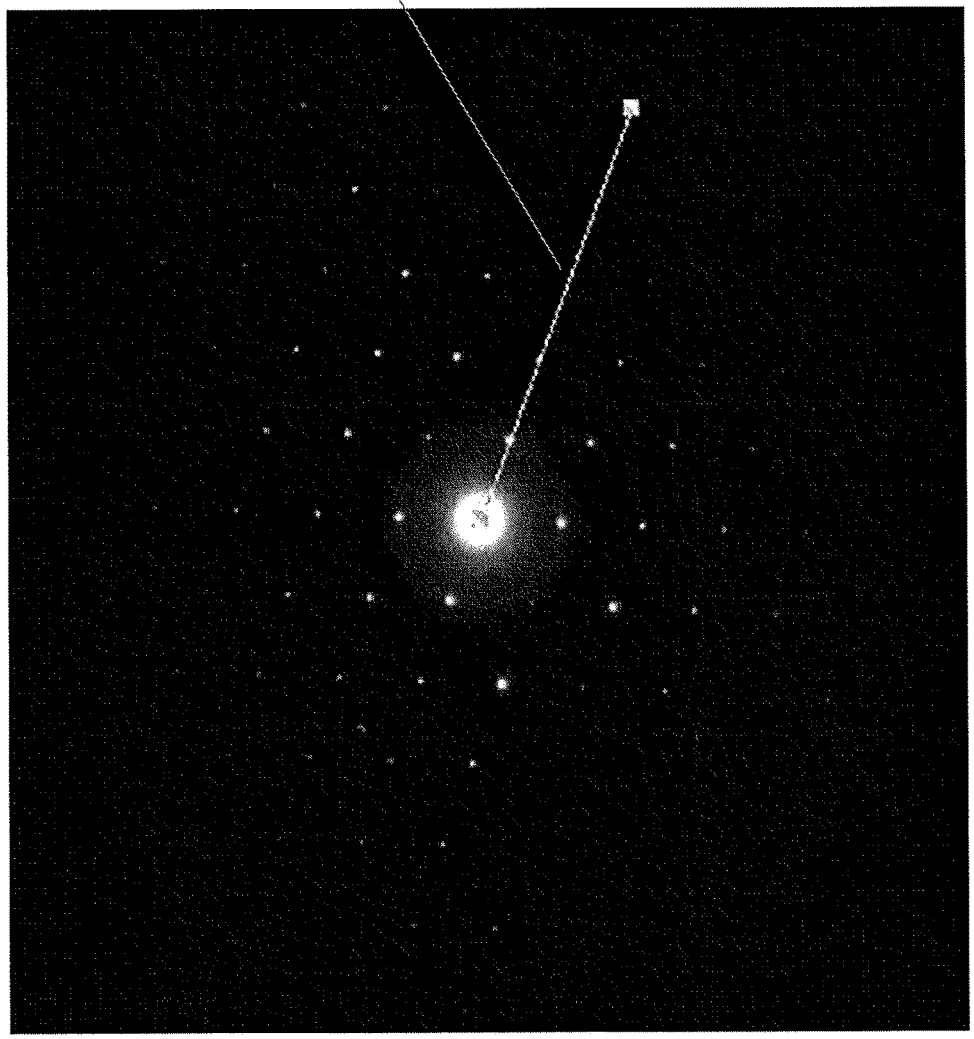
FIG. 1A is an image relating to the prior art.
Figure 1B:
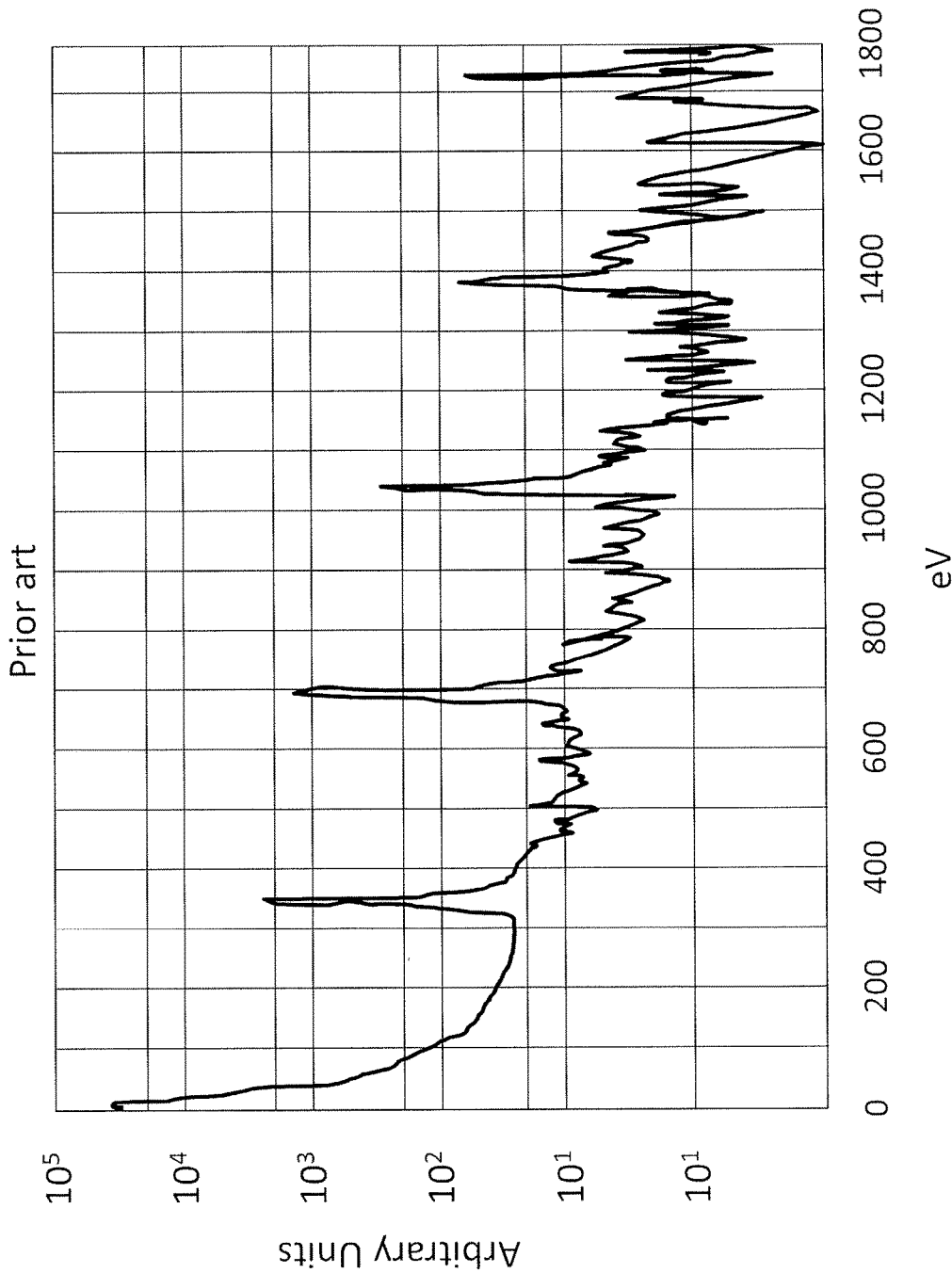
FIG. 1B is a graph of intensity for the image in FIG. 1B.
Figure 2A:
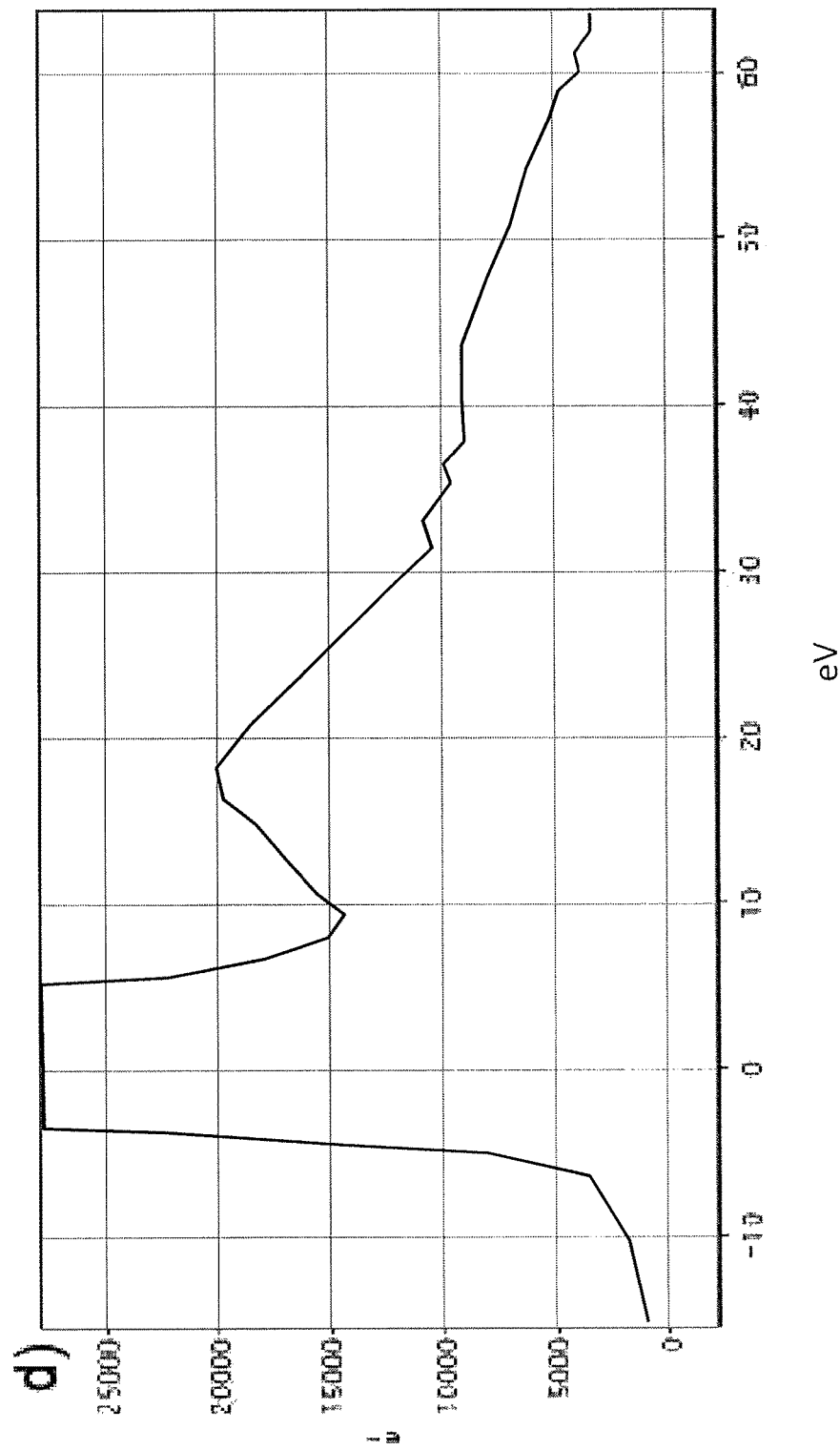
FIG. 2A is a graph relating to the prior art.
Figure 2B:
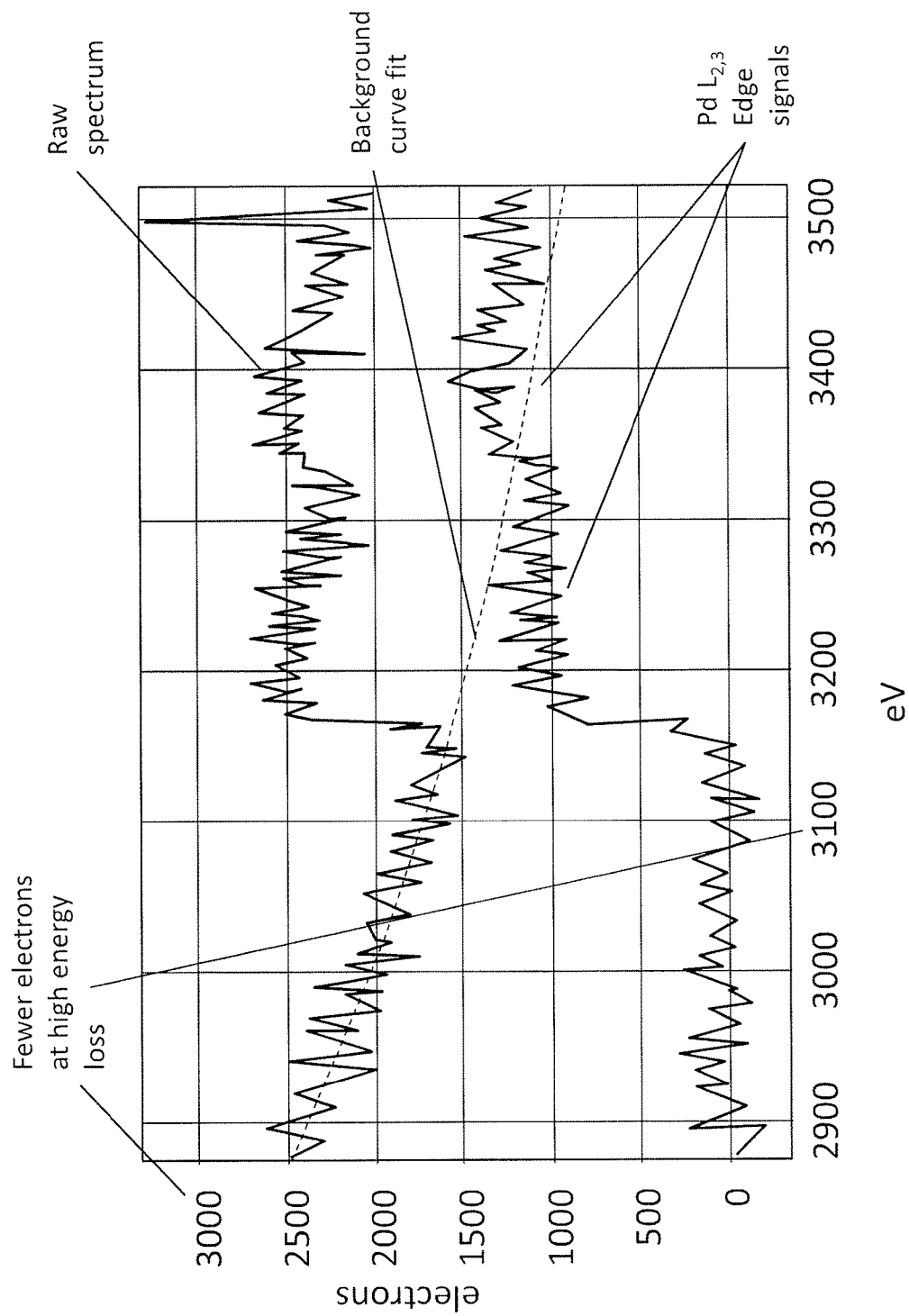
FIG. 2B is a graph relating to the prior art.
Figure 3A:
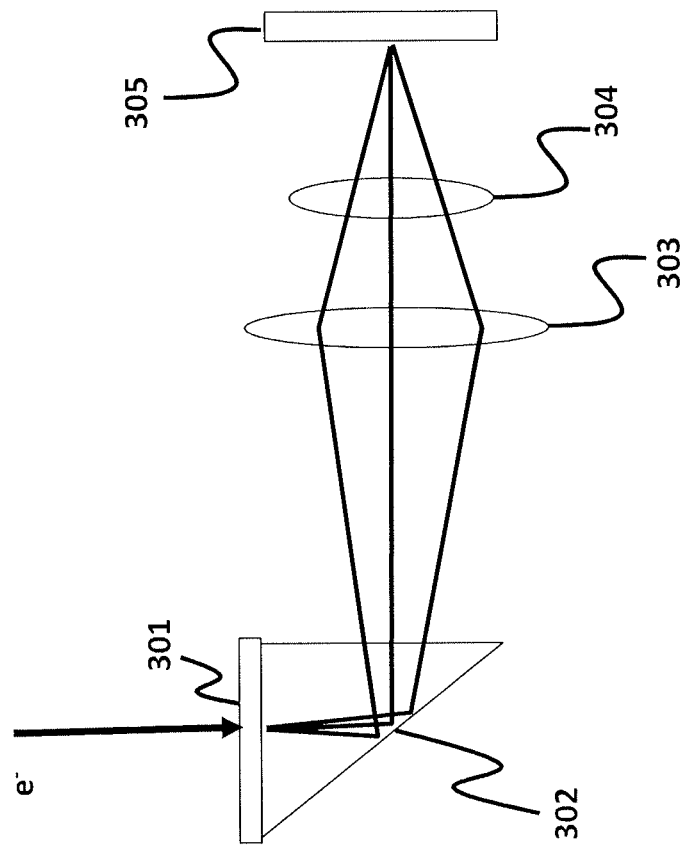
FIG. 3A is a prior art indirect detector coupling design.
Figure 3B:
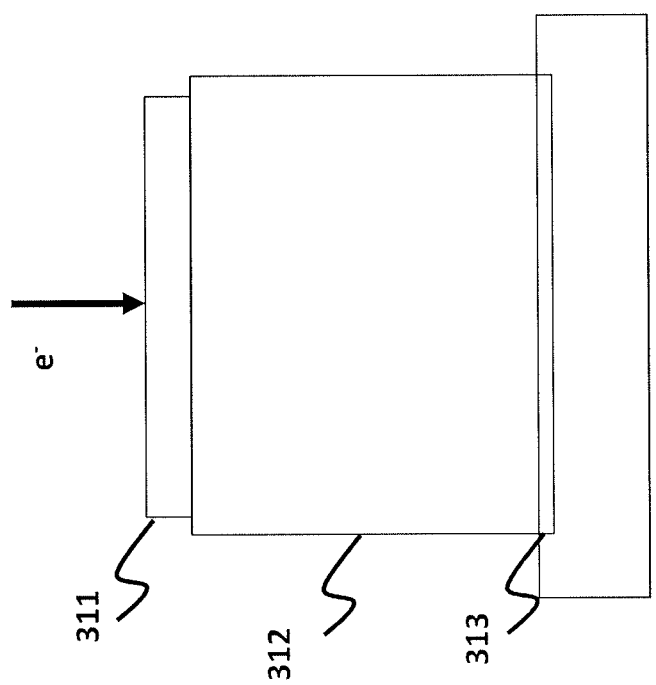
FIG. 3B is a prior art indirect detector coupling design.
Figure 3C:
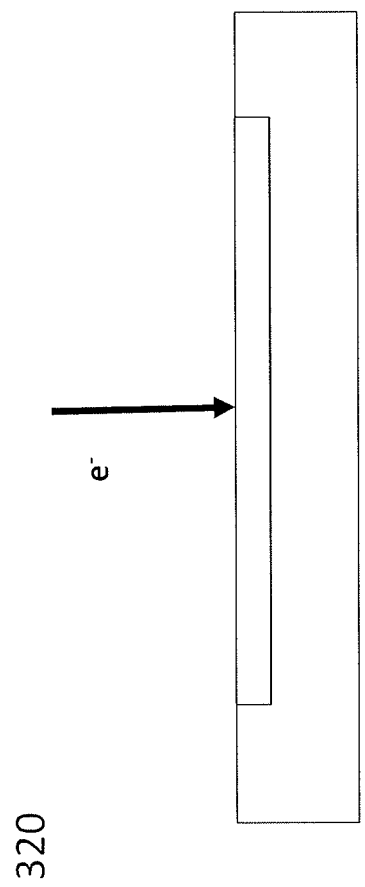
FIG. 3C is a prior art direct detector design.
Figure 3D:
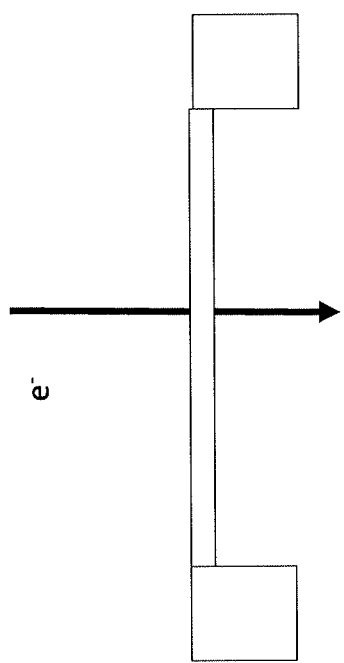
FIG. 3D is a prior art direct detector design.
Figure 4C:
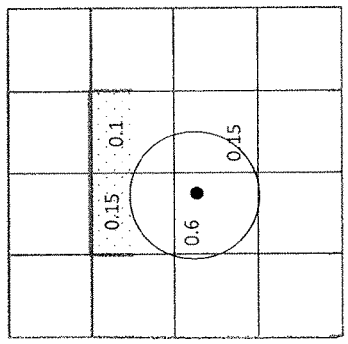
FIG. 4C is a diagram of electron detection
Figure 4B:
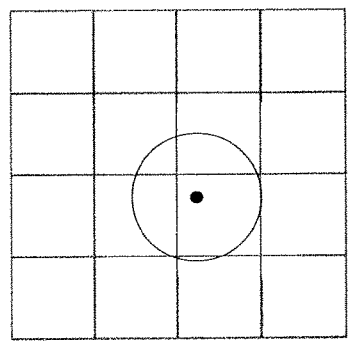
FIG. 4B is a diagram of electron detection
Figure 4E:
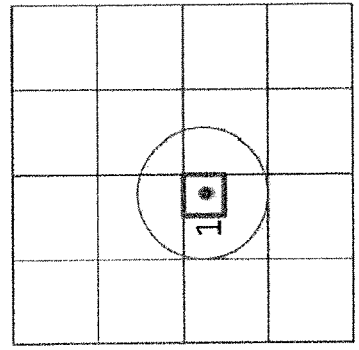
FIG. 4E is a diagram showing electron detection event signal processing.
Figure 4A:
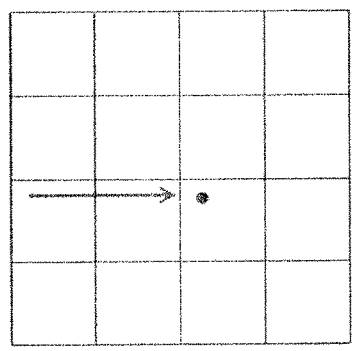
FIG. 4A is a diagram of electron detection.
Figure 4D:
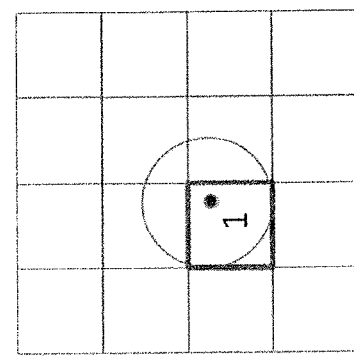
FIG. 4D is a diagram showing electron detection event signal processing.
Figure 8A:
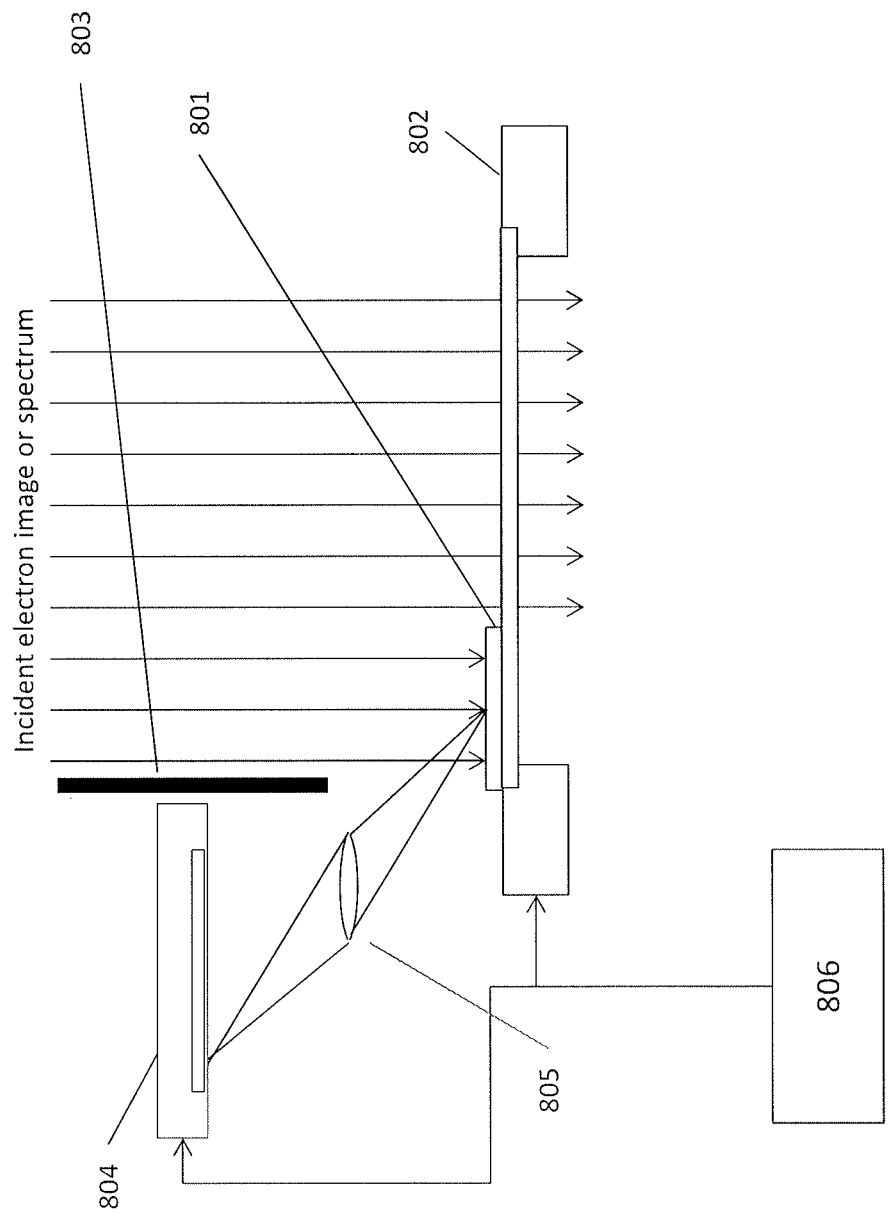
FIG. 8A shows a dual detector having a scintillator in contact with and on top of a direct detector with the scintillator being optically coupled to a second detector.
Figure 8B:
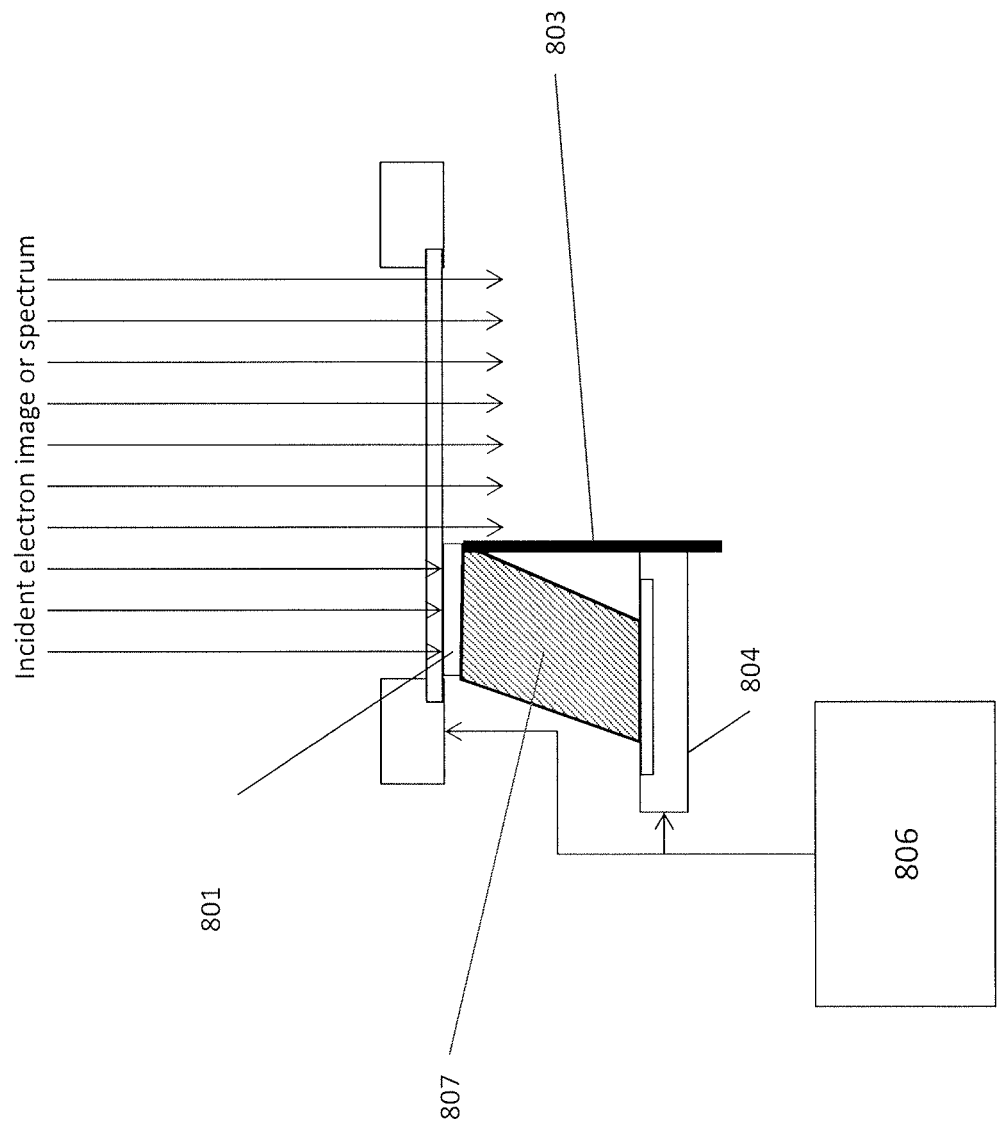
FIG. 8B shows a dual detector having a scintillator in contact with and below a direct back-illuminated detector with the scintillator being coupled by a skewed fiber bundle to a second detector.
Figure 8C:
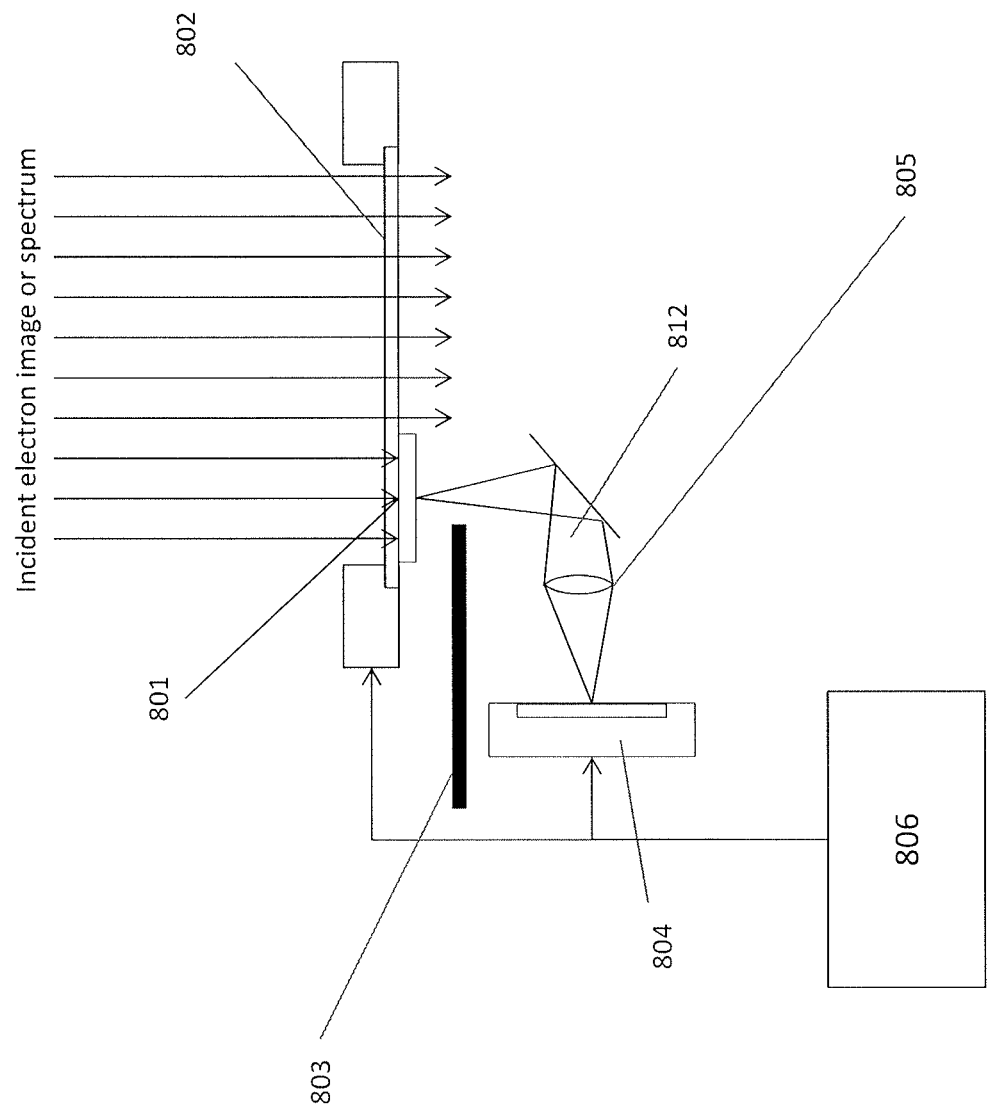
FIG. 8C shows a dual detector having a scintillator in contact with and below a direct thinned back-illuminated detector with the scintillator being coupled by a mirror and optical lenses to a second detector.

FIGS. 8A through 8C show example configurations which place the scintillator 801 in contact with the direct detection device 802. In these configurations it is necessary to couple the light to a second detector 804 which must be placed out of the way of the incident beam. This is 5 because while light generated in the scintillator can be detected by the direct detector the signal will be overwhelmed by the scattered electron beam which will still be detected by the direct detection device under the scintillator. FIG. 8A shows a possible lens-optical 805 arrangement including a shield 803 to prevent scattered electrons from reaching the optical detector 804. A synchronizer 806 controls readout of the directly exposed detector 803 and the optical detector 10 804. FIG. 8B shows a fiber-optically coupled arrangement with the scintillator 801 beneath the detector 802. The scintillator 801 is coupled to the second detector 804 by a skewed fiber optic plate 807 FIG. 8C shows a lens-optically 805 coupled arrangement with the scintillator 804 beneath the detector 802 and using a mirror 812 to redirect the scintillator image to the second detector. A means of synchronization is provided to allow the outputs of the two detectors to be 15 merged into a single hybrid image. The embodiments shown in FIGS. 7A-F and 8A-C are only representative and do not constitute all possible arrangements using this concept. An example of an extension not shown would be to move the in-contact scintillator to the center of the device for the application of diffraction (FIGS. 1A and 1B) using lens-coupling to avoid occluding any part of the electron image or the creation of backscatter if located under the device.

Figure 9A:
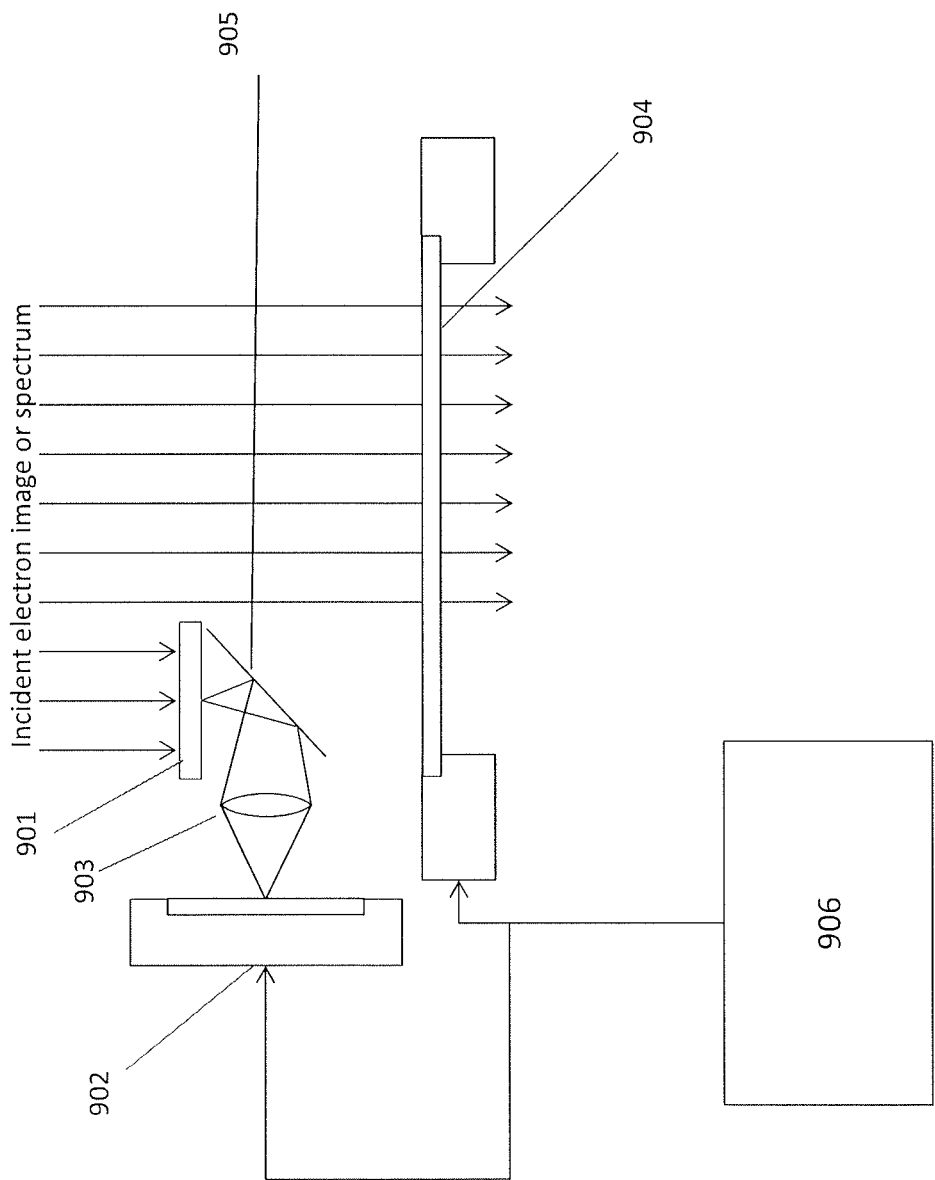
FIG. 9A shows a dual detector having a scintillator not in contact with and in front of a direct detector, lens coupled to a separate optical sensor with means for synchronizing the two detectors.
Figure 9B:
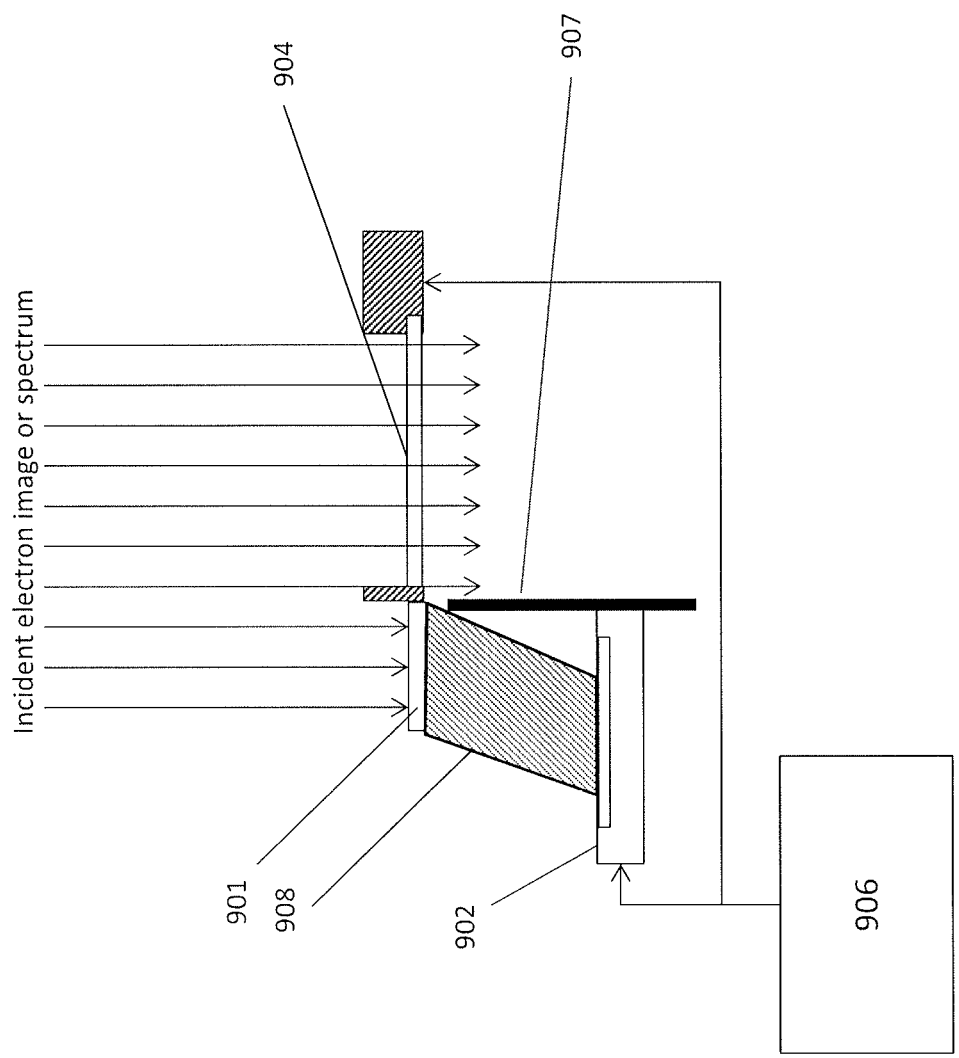
FIG. 9B shows a dual detector having a scintillator-coupled indirect detector next to and in close proximity to a direct back-illuminated detector with the scintillator being coupled by a skewed fiber bundle to enable the very close juxtaposition of the electron detection planes of the two detectors, with means for synchronizing the two detectors.

FIGS. 9A and 9B show arrangements of two detectors arranged without physical contact of either the scintillator 901 or the detector 904. FIG. 9A shows a lens-coupled camera 902 located in front of the direct detection sensor 904 and with optical design 903, 905 so as to minimize dead pixels between optically-coupled 902 and direct-detection sensor 904 s. This design would also serve to minimize scatter of electrons from the scintillator onto the direct-detection portion of the hybrid detector. FIG. 9B shows a possible arrangement of two detectors 902, 904 with detection surfaces in the same plane. The embodiment in Figure B includes a detector 904 designed to minimize dead area, and a shield 907. The scintillator 901 is 5 coupled to the light sensor 902 by a skewed fiber optic bundle. As for the previous cases shown in FIGS. 8A-8C, FIG. 9A shows a synchronizer 906 to control readout of the directly exposed detector 904 and the optical detector comprised of scintillator 901, image sensor 902 and optics 905 and 903.

Figure 10A:
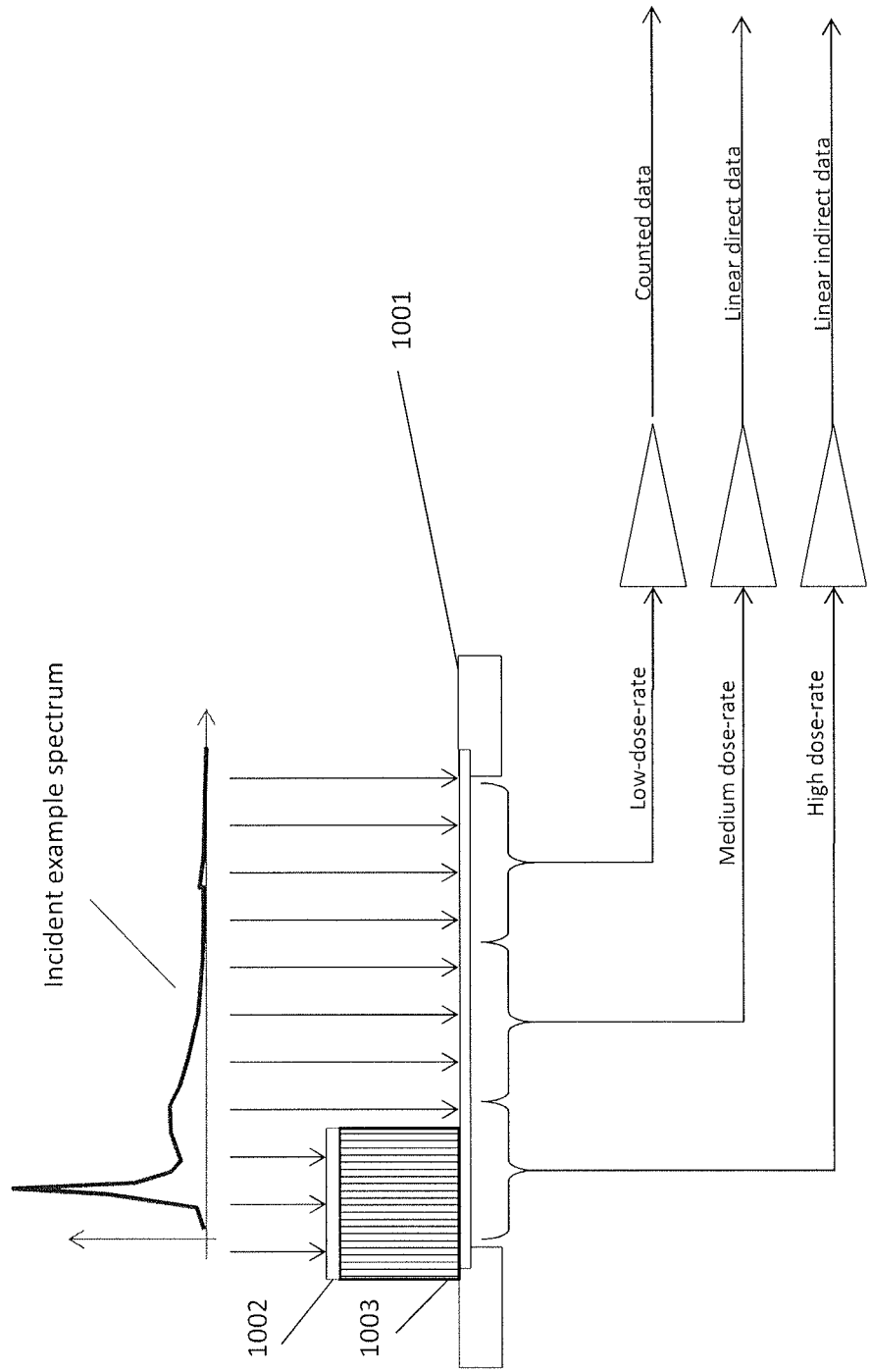
FIG. 10A shows an exemplary hybrid energy conversion detector with three types of data read out simultaneously from three separate regions of the detector.
Figure 10B:
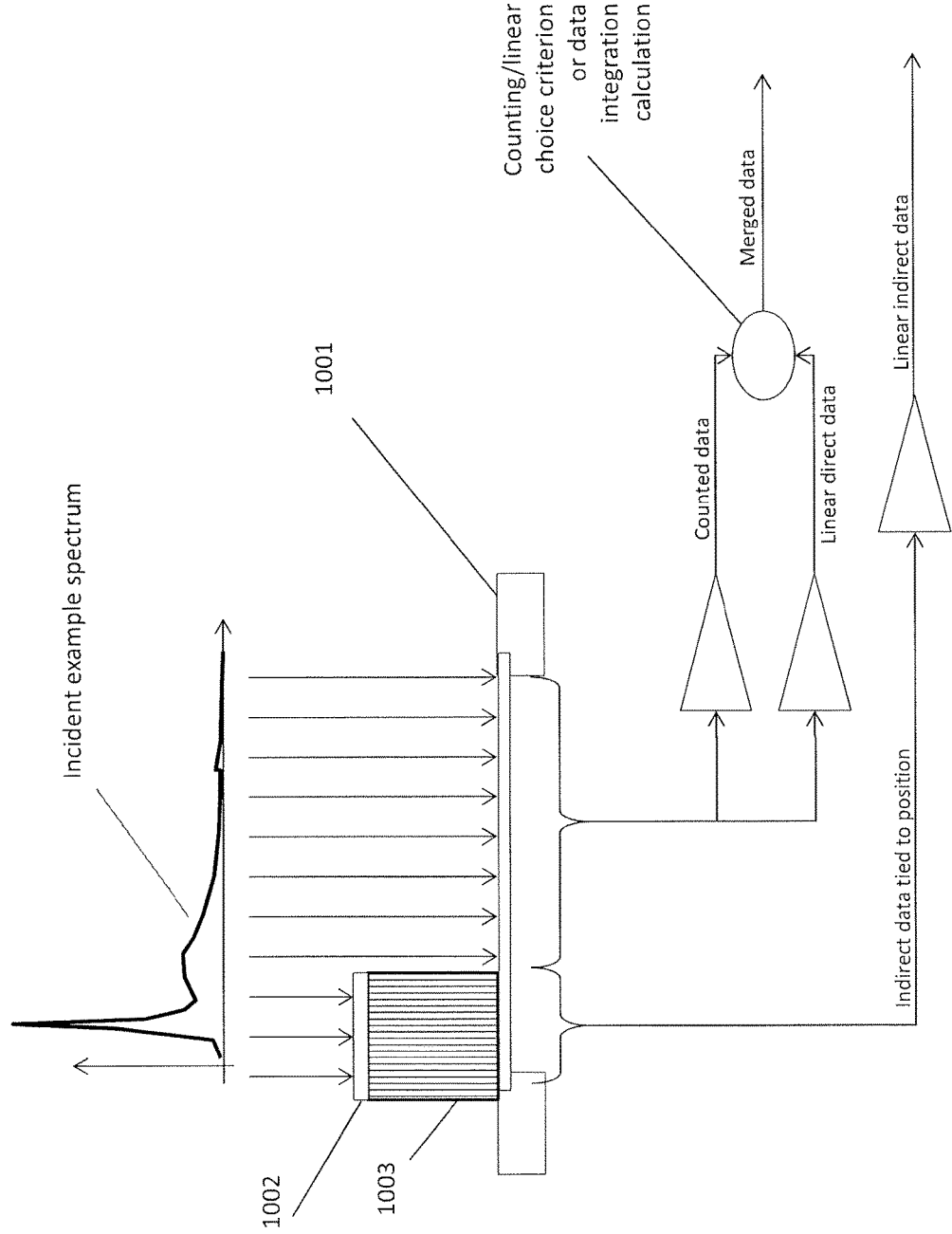
FIG. 10B shows a further exemplary hybrid energy conversion detector with three types of data read out simultaneously from three separate regions of the detector in such a way that both the counted and the linearly read direction detection data is merged to allow optimal integration of both types of data.

FIGS. 10A and 10B concern image processing options and the extension of the hybrid concept to cover a combination of both linearly detected and counted data. FIG. 10A shows linear indirect, linear direct and counted direct-detection data being read out by the detector 1001, from the high, medium and low-dose portions of the image or spectrum. The embodiment shown here includes a scintillator 1002 coupled to the detector by a fiber optic bundle 1003. The position of transition from linear direct detection to counted direct detection would be determined by the illumination pattern and the switchover illumination intensity and would therefore vary from one image to the next—and might happen more than once in an image. FIG. 10B shows an arrangement that processes every pixel in the direct detection area both as a linear pixel and with counting or centroiding. While this increases the amount of data which needs to be saved, it creates the possibility of selecting or merging the data offline for a more highly optimized synthesis of data. It should be clear that the above combinations are just representative of a much larger set of combinations.

With respect to FIG. 8, Separate detectors could be operated with or without synchronization. Exposure times could be the same or different for the indirect and direct portions of the detector. With the scintillator in direct contact with the direct detector, the direct detector will be exposed to the intense beam and so will age quickly. However, since that part of the detector is not needed due to the presence of the indirectly coupled sensor, it can be allowed to become non-functional.

With respect to FIG. 9, Separate detectors could be operated with or without synchronization. Exposure times could be the same or different for the indirect and direct portions of the detector.

We claim:

1. A hybrid energy-conversion detector (HECD) for receiving a beam of electron radiation having predetermined high and low illumination intensity portions, the detector comprising:
   an energy converting scintillator exposed to the high illumination intensity portion of the beam of electron radiation, said scintillator generating light from said high illumination intensity portion of the beam of electron radiation;
   an image sensor that includes:
      a first image sensor portion arranged and adapted for receiving said light from said energy converting scintillator and for processing an image; and
      a second image sensor portion arranged and adapted for directly receiving the low illumination intensity portion of the beam of electron radiation and for processing an image,
   wherein said scintillator is exposed to the high illumination intensity portion of the beam of electron radiation, and
   wherein said second sensor portion is exposed to said low intensity portion of the beam of electron radiation and
   wherein said exposure of said first image sensor portion to said light and said exposure of said second sensor portion to the low illumination intensity portion of the beam of electron radiation occurs at least in part simultaneously.

2. The HECD of claim 1, wherein said first and second image sensor portions are on a single silicon device.

3. The HECD of claim 1, wherein said scintillator is coupled via optics to said first image sensor portion.

4. The HECD of claim 3, wherein said second image sensor portion is substantially shielded from direct high energy electron exposure.

5. The HECD of claim 1, wherein said first and second image sensor portions are read out simultaneously.

6. The HECD of claim 1, wherein said first and second image sensor portions are read out independently.

7. The HECD of claim 1, wherein said first and second image sensor portions comprise separate silicon devices.

8. The HECD of claim 7, wherein said scintillator is applied directly to the silicon device comprising said second image sensor portion in an area expected to receive the high illumination intensity portion of the beam of electron radiation and wherein the light image produced by said scintillator is projected by optics onto said first image sensor portion.

9. The HECD of claim 7, wherein said scintillator is located on an electron entry surface of the silicon device comprising said second image sensor portion.

10. The HECD of claim 7, wherein said second image sensor portion is a thinned direct detection device having a directly exposed surface and a back surface behind said directly exposed surface and wherein said scintillator is located on said back surface.

11. The HECD of claim 7, wherein said scintillator is mounted not in contact with said second image sensor portion.

12. The HECD of claim 2, wherein said scintillator is mounted in front of said single silicon device so as to cover said first image sensor portion, said front being the surface of said single silicon device directly exposed to said beam of electron radiation.

13. The HECD of claim 7, wherein said scintillator is mounted next to said second image sensor portion.

14. The HECD of claim 7, wherein said first and second image sensor portions are read out simultaneously.

15. The HECD of claim 7, wherein said first and second image sensor portions are read out independently.

* * * * *